(12) United States Patent
Son

(10) Patent No.: US 11,830,883 B2
(45) Date of Patent: Nov. 28, 2023

(54) DISPLAY DEVICE INCLUDING FAN-OUT WIRE WITH VARIOUS WIDTHS

(71) Applicant: Samsung Display Co., Ltd., Yongin-si (KR)

(72) Inventor: Sun Kwun Son, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/588,115

(22) Filed: Jan. 28, 2022

(65) Prior Publication Data

US 2022/0149083 A1    May 12, 2022

Related U.S. Application Data

(63) Continuation of application No. 16/684,384, filed on Nov. 14, 2019, now Pat. No. 11,271,019.

(30) Foreign Application Priority Data

Apr. 1, 2019   (KR) ........................ 10-2019-0038044

(51) Int. Cl.
*H01L 27/12* (2006.01)
*H05K 1/18* (2006.01)
*G02F 1/1362* (2006.01)
*H10K 59/131* (2023.01)

(52) U.S. Cl.
CPC ...... *H01L 27/124* (2013.01); *G02F 1/136286* (2013.01); *H05K 1/189* (2013.01); *H10K 59/131* (2023.02)

(58) Field of Classification Search
CPC ............... H01L 27/124; H01L 27/3276; G02F 1/136286; G02F 1/1345; G02F 1/13452; G02F 1/1303; G02F 1/13454; H05K 1/189; H05K 2201/09227; H05K 2201/09236; H05K 2201/09263; H05K 1/147; H05K 2201/05; G03F 1/38
See application file for complete search history.

(56) References Cited

U.S. PATENT DOCUMENTS

| 9,691,791 | B2 | 6/2017 | Jeon et al. |
| 2007/0002243 | A1 | 1/2007 | Kim |
| 2008/0062666 | A1 | 3/2008 | Lim et al. |
| 2008/0129944 | A1 | 6/2008 | Park |
| 2008/0157364 | A1 | 7/2008 | Yang et al. |

(Continued)

FOREIGN PATENT DOCUMENTS

| KR | 10-2017-0139189 A | 12/2017 |
| KR | 10-1884346 B1 | 8/2018 |

*Primary Examiner* — David D Davis
(74) *Attorney, Agent, or Firm* — Lewis Roca Rothgerber Christie LLP

(57) ABSTRACT

A display device includes: a substrate having a display area and a peripheral area; a first wiring layer to transfer a gate signal in the display area; a second wiring layer to transfer a data voltage in the display area; a data fan-out having a first data fan-out wire connected to the second wiring layer; and a data flexible printed circuit board electrically connected to the first data fan-out wire in the peripheral area. The first data fan-out wire includes a first zigzag portion having a zigzag shape and a first straight portion that extends from the first zigzag portion. A width of the first straight portion is larger than a width of the first zigzag portion.

13 Claims, 12 Drawing Sheets

(56) References Cited

U.S. PATENT DOCUMENTS

| | | | |
|---|---|---|---|
| 2010/0155729 A1 | 6/2010 | Yang et al. | |
| 2010/0283955 A1 | 11/2010 | Kim et al. | |
| 2014/0022148 A1 | 1/2014 | Kim et al. | |
| 2015/0069348 A1 | 3/2015 | Tae | |
| 2016/0035307 A1* | 2/2016 | Jeon | G09G 3/20 345/82 |
| 2016/0306212 A1* | 10/2016 | Lim | G02F 1/1339 |
| 2016/0365062 A1* | 12/2016 | Wu | G09G 5/003 |
| 2017/0047347 A1* | 2/2017 | Kim | H01L 27/1248 |
| 2017/0059955 A1 | 3/2017 | Lee et al. | |
| 2017/0235199 A1 | 8/2017 | Wang et al. | |
| 2017/0358641 A1* | 12/2017 | Park | H01L 51/0097 |
| 2018/0053473 A1 | 2/2018 | Wang et al. | |
| 2019/0095007 A1* | 3/2019 | Jeong | G06F 1/1626 |
| 2020/0312882 A1* | 10/2020 | Son | H01L 27/3276 |

\* cited by examiner

DISPLAY DEVICE INCLUDING FAN-OUT WIRE WITH VARIOUS WIDTHS

CROSS-REFERENCE TO RELATED APPLICATIONS

This application is a continuation of U.S. patent application Ser. No. 16/684,384, filed Nov. 14, 2019, which claims priority to and the benefit of Korean Patent Application No. 10-2019-0038044, filed Apr. 1, 2019, the entire content of both of which is incorporated herein by reference.

BACKGROUND

1. Field

Some example embodiments of the present disclosure relate to a display device, a photomask, and a manufacturing method of a display device.

2. Description of the Related Art

Display devices such as organic light emitting diode displays and liquid crystal display have become widely used. In general, a display device includes a plurality of pixels, which are units for displaying an image, and a driving unit. The driving unit includes a data driver for applying a data voltage to the pixels, and a gate driver for applying a gate signal for controlling the transfer of the data voltage.

The gate driver and the data driver may be mounted on a printed circuit board (PCB) in the form of a chip, to be connected to the display panel. Alternatively, in the case of a gate driver which does not require high mobility of a channel of a thin film transistor, it may be integrated on a display panel without forming it as a separate chip.

The above information disclosed in this Background section is only for enhancement of understanding of the background of the invention and therefore it may contain information that does not constitute prior art.

SUMMARY

Aspects of some example embodiments may include a display device and a manufacturing method of a display device in which a dead space is minimized or reduced and luminance is relatively uniform throughout a display area.

Aspects of some example embodiments may include a photomask that can prevent or reduce defects of open-circuits due to disconnection of fan-out wires or short-circuits between adjacent fan-out wires during fan-out wiring patterning.

According to some example embodiments, a display device includes: a substrate including a display area and a peripheral area; a first wiring layer configured to transfer a gate signal in the display area; a second wiring layer configured to transfer a data voltage in the display area; a data fan-out including a first data fan-out wire connected to the second wiring layer; and a data flexible printed circuit board electrically connected to the first data fan-out wire in the peripheral area, wherein the first data fan-out wire includes a first zigzag portion having a zigzag shape and a first straight portion that extends from the first zigzag portion, and a width of the first straight portion is larger than a width of the first zigzag portion.

According to some example embodiments, the data fan-out may further include a second data fan-out wire adjacent to the first data fan-out wire, the second data fan-out wire may include a second zigzag portion having a zigzag shape and a second straight portion that extends from the second zigzag portion, each of the first zigzag portion and the second zigzag portion may include portions that extend in a first direction and portions that extend in a second direction crossing the first direction, and a minimum distance between the first zigzag portion and the second zigzag portion may be larger than a distance between the portions that extend in the first direction of the first zigzag portion.

According to some example embodiments, the second data fan-out wire may be closer to a center of the data fan-out than the first data fan-out wire, and a length of the second zigzag portion may be longer than a length of the first zigzag portion.

According to some example embodiments, a length of the first straight portion may be longer than a length of the second straight portion.

According to some example embodiments, a width of the first data fan-out wire may be larger than a width of the second data fan-out wire.

According to some example embodiments, the gate flexible printed circuit board may include a data driver integrated circuit.

According to some example embodiments, the peripheral area may include a gate driver.

According to some example embodiments, the display device may further include: a gate fan-out including a first gate fan-out wire connected to the first wiring layer; and a gate flexible printed circuit board electrically connected to the first gate fan-out wire in the peripheral area of the substrate, wherein the first gate fan-out wire may include a third zigzag portion having a zigzag shape and a third straight portion that extends from the third zigzag portion, and a width of the third straight portion may be larger than a width of the third zigzag portion.

According to some example embodiments, the gate fan-out may further include a second gate fan-out wire adjacent to the first gate fan-out wire, the second gate fan-out wire may include a fourth zigzag portion having a zigzag shape and a fourth straight portion that extends from the fourth zigzag portion, each of the third zigzag portion and the fourth zigzag portion may include portions that extend in a first direction and portions that extend in a second direction crossing the first direction, and a minimum distance between the third zigzag portion and the fourth zigzag portion may be larger than a distance between the portions that extend in the second direction in the second zigzag portion.

According to some example embodiments, the second gate fan-out wire may be closer to a center of the gate fan-out than the first gate fan-out wire, and a length of the fourth zigzag portion may be longer than a length of the third zigzag portion.

According to some example embodiments, a length of the third straight portion may be longer than a length of the fourth straight portion.

According to some example embodiments, a width of the first gate fan-out may be larger than a width of the second gate fan-out wire.

According to some example embodiments, a photomask includes: a transmissive portion configured to transmit light; and a blocking portion configured to block light, wherein the blocking portion may include a first zigzag portion having a zigzag shape and a first straight portion that extends from the first zigzag portion, and a width of the first straight portion may be larger than a width of the first zigzag portion.

According to some example embodiments, the blocking portion may include a first slit, and the first slit may extend from the first zigzag portion to the first straight portion.

According to some example embodiments, the blocking portion may further include: a second zigzag portion having a zigzag shape; a second straight portion extending from the second zigzag portion; and a second slit extending from the second zigzag portion to the second straight, wherein each of the first zigzag portion and the second zigzag portion may include portions that extend in a first direction and portions that extend in a second direction crossing the first direction, and a minimum distance between the first zigzag portion and the second zigzag portion may be larger than a distance between the portions that extend in the first direction in the first zigzag portion.

According to some example embodiments, a length of the second zigzag portion may be longer than a length of the first zigzag portion.

According to some example embodiments, in a manufacturing method of a display device, the method includes: forming a conductive layer on a substrate; forming a photoresist film on the conductive layer; forming a photoresist pattern by exposing and developing the photoresist film using a photomask; and forming a zigzag portion and a straight portion of a fan-out wire by etching the conductive layer, and a width of a straight portion of the fan-out wire may be larger than a width of a zigzag portion of the fan-out wire.

According to some example embodiments, the photomask may include a blocking portion having a shape corresponding to the fan-out wire and a transmissive portion as an outer region, and the blocking portion may include a slit formed along a direction in which the blocking portion extends.

According to some example embodiments, a width of the fan-out wire formed in the forming of the zigzag portion and the straight portion of the fan-out wire may be smaller than a width of the blocking portion of the photomask.

According to some example embodiments, the fan-out wire may be electrically connected to a data driving integrated circuit or a gate driving integrated circuit.

According to some example embodiments, even when a distance between the flexible printed circuit board and the display area is narrow, uniform luminance can be obtained throughout the display area, and the dead space can be reduced.

Further, defects of open-circuits due to disconnection of fan-out wires or short-circuits between adjacent fan-out wires can be prevented or reduced by adjusting a width of the fan-out wires or a distance therebetween.

In addition, resolution of the photomask may be increased by using the photomask including the slit when the fan-out wires are formed.

DETAILED DESCRIPTION

Figure 1:
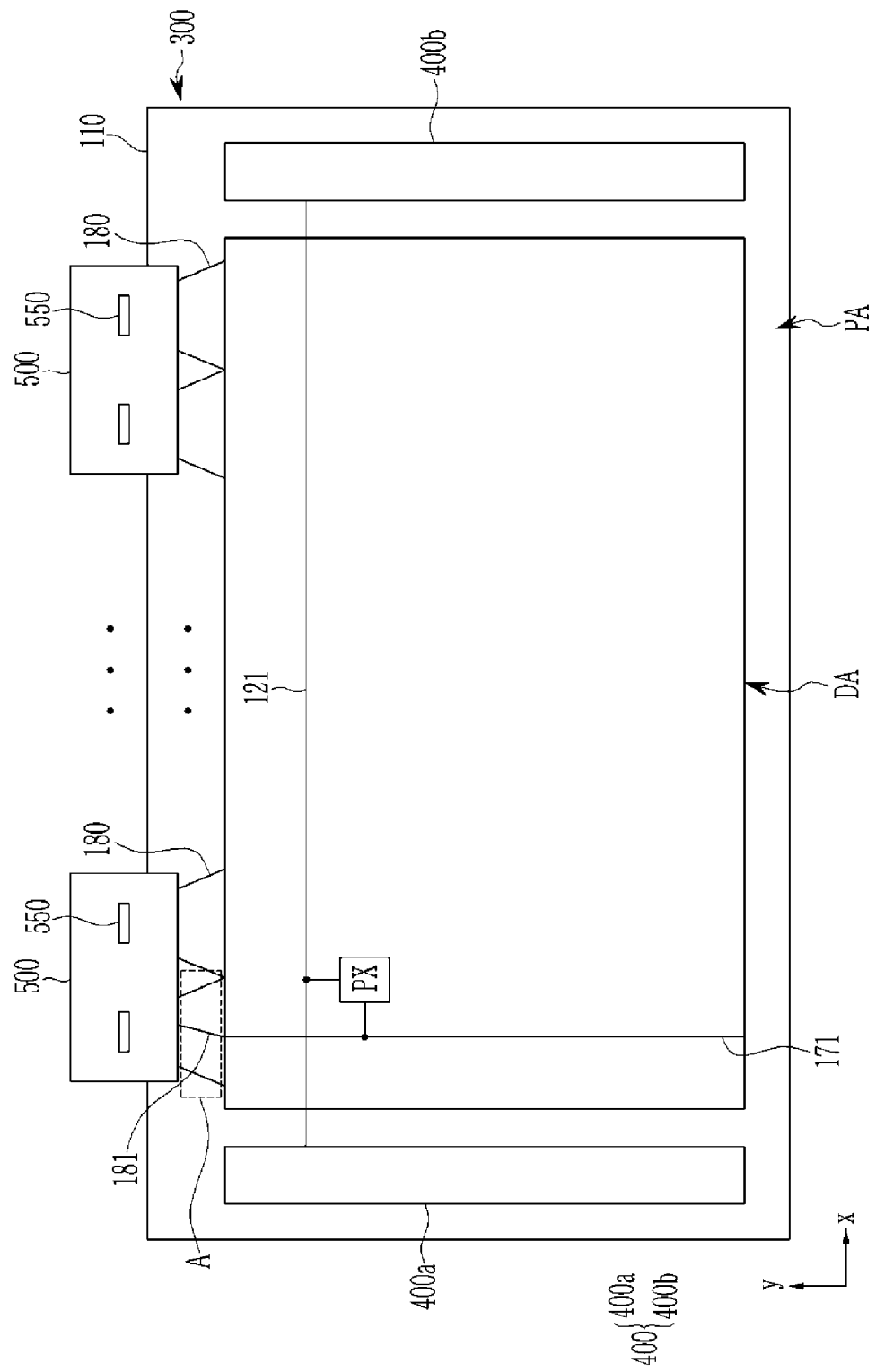
FIG. 1 illustrates a schematic block diagram of a display device according to some example embodiments.

Hereinafter, aspects of some example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The display device and/or any other relevant devices or components according to embodiments of the present invention described herein may be implemented utilizing any suitable hardware. For example, the display device may include a display panel and at least one data flexible printed circuit board and/or at least one gate flexible printed circuit board. The at least one data flexible printed circuit board may include a data driving integrated circuit that is connected to the display panel by a data fan-out. The at least one gate flexible printed circuit board may include a gate driving integrated circuit that is connected to the display panel by a gate fan-out. The various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Also, a person of skill in the art should recognize that the functionality of various components may be combined or integrated into a single component, or the functionality of a particular component device may be distributed across one or more other component devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 illustrates a schematic block diagram of a display device according to some example embodiments. The display device according to some example embodiments includes a display panel 300, and at least one data flexible printed circuit board 500.

The display panel 300 may be included in various display devices such as a liquid crystal display (LCD), an organic light emitting diode (OLED) display, and the like.

The display panel 300 includes a substrate 110, and the substrate 110 includes a display area DA for displaying an image and a peripheral area PA as a remaining area.

A plurality of gate lines 121, a plurality of data lines 171, and a plurality of pixels PX connected to the gate lines 121 and the data lines 171 are located in the display area DA.

The gate lines 121 may transfer a gate signal, may extend substantially in a first direction x, and may be approximately parallel to each other.

The data lines 171 may transfer a data voltage corresponding to an image signal, may extend in a second direction y that crosses the first direction x, and may be substantially parallel to each other. The gate lines 121 and the data lines 171 may be referred to as a first wiring layer and a second wiring layer, respectively.

The pixels PX are arranged in a substantially matrix form. Each of the pixels PX may include at least one switching element electrically connected to the gate line 121 and the data line 171, and at least one pixel electrode connected thereto. The switching element, which is an electrical element such as a thin film transistor integrated on the display panel 300, may include a gate terminal, an input terminal, and an output terminal. The switching element may be turned on or off according to the gate signal of the gate line 121 to selectively transfer the data voltage from the data line 171 to the pixel electrode. The pixels PX may display a corresponding image depending on the data voltage applied to the pixel electrode. The peripheral area PA may be located around (e.g., to surround) the display area DA, or may be located at an edge of the display panel 300.

A gate driver 400 may be located on opposite sides of the peripheral area PA. The gate line 121 and the data line 171 of the display area DA may be located in the peripheral area PA and may extend from the display area DA.

The gate driver 400 may be connected to the gate line 121 to transfer the gate signal to the gate line 121. The gate driver 400 may be formed directly on the peripheral area PA of the display panel 300 together with electrical elements such as the thin film transistor of the display area DA through a same process.

The gate driver 400 includes a first gate driver 400a and a second gate driver 400b that are located at opposite sides of the peripheral area PA with respect to the display area DA. In this example embodiment, the first gate driver 400a is located at a left side of the peripheral area PA and the second gate driver 400b is located at a right side of the peripheral area PA.

The first gate driver 400a may include a plurality of stages connected in a dependent manner, and the second gate driver 400b may include a plurality of stages that are connected in a dependent manner. Corresponding stages of the first gate driver 400a and the second gate driver 400b may be connected to the same gate line 121 to apply a gate signal. As such, even when display panel 300 is enlarged, display errors due to delay of gate signal may be prevented or reduced by applying a gate signal to the gate line 121 from the opposite sides of the display panel 300.

Although the first gate driver 400a and the second gate driver 400b are illustrated in FIG. 1 to be respectively located at the left side and the light side of the peripheral area PA, the embodiment is not limited thereto, and the first gate driver 400a and the second gate driver 400b may be located anywhere in the peripheral area PA. According to another exemplary embodiment, one of the first gate driver 400a and the second gate driver 400b may be omitted. A data fan-out 180 connected to the data line 171 is located in the display area DA is located in the peripheral area PA. The data fan-out 180 includes a plurality of data fan-out wires 181. The data fan-out wires 181 are located in the peripheral area PA, and are located between the data flexible printed circuit board 500 and the display area DA. A first end of each of the data fan-out wires 181 is electrically connected to the data line 171 of the display area DA in the peripheral area PA, and a second end of each of the data fan-out wires 181 is connected to a data driving integrated circuit 550 of the data flexible printed circuit board 500 to be described later.

The data fan-out wires 181 may be located at a same layer as the gate lines 121 which are located in the display area DA, and may be connected to the data lines 171 of the display area DA through an opening. However, the embodiment is not limited thereto, and the data fan-out wires 181 may be located at a same layer as the data lines 171 of the display area DA in the peripheral area PA, or may be located at a different layer from those of the gate lines 121 and the data lines 171.

The data flexible printed circuit board 500 may be bent, and one side of the data flexible printed circuit board 500 may be connected to the data fan-out wires 181 of the display panel 300 in the peripheral area PA of the display panel 300. The data flexible printed circuit board 500 includes the data driver IC 550 for generating a data voltage that is a grayscale voltage (e.g., a gray voltage) corresponding to an input video signal. Although one data flexible printed circuit board 500 is illustrated in FIG. 1 to include two data drive integrated circuits 550, the embodiment is not limited thereto, and one data flexible printed circuit board 500 may include only one data driving integrated circuit 550, or may include three or more data driving integrated circuits 550.

Figure 2:
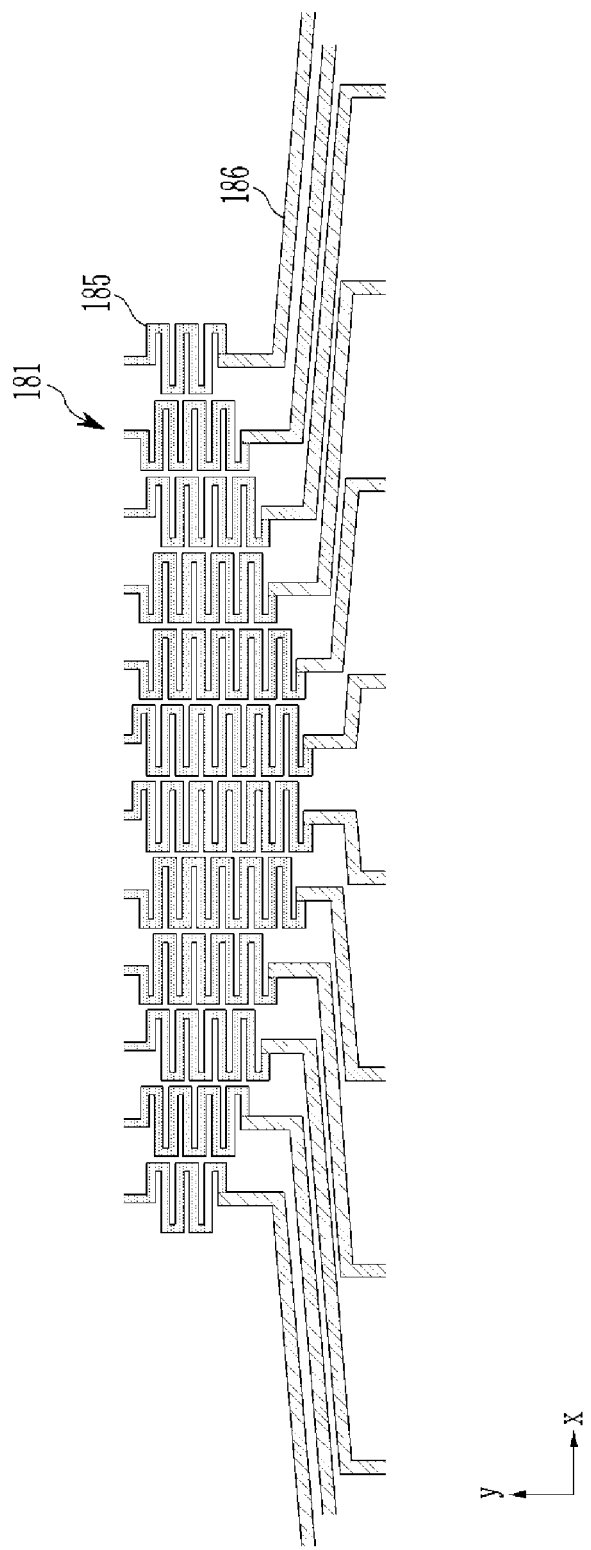
FIG. 2 illustrates an enlarged plan view of a portion A of the display device illustrated in FIG. 1.
Figure 3:
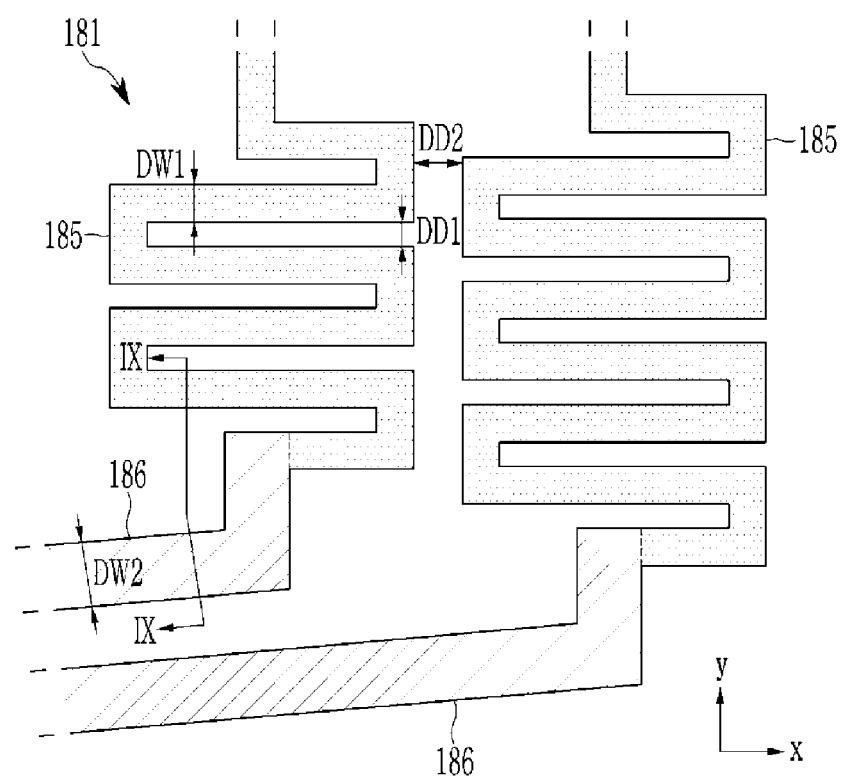
FIG. 3 illustrates a top plan view of some data fan-out wires.

Hereinafter, the data fan-out 180 of the display device according to the exemplary embodiment will be described with reference to FIG. 2 and FIG. 3. FIG. 2 illustrates an enlarged plan view of a portion A of the display device illustrated in FIG. 1, and FIG. 3 illustrates a top plan view of some data fan-out wires. For example, FIG. 3 illustrates an enlarged top plan view of two data fan-out wires 181 illustrated at a left side of FIG. 2.

Referring to FIG. 2, each of the data fan-out wires 181 includes a zigzag portion 185 and a straight portion 186. The zigzag portion 185 may be located adjacent to the data flexible printed circuit board 500 of FIG. 1, and may extend substantially in a second direction y. One end of the zigzag portion 185 may be electrically connected to the data flexible printed circuit board 500.

The zigzag portion 185 is a zigzag-shaped portion of the data fan-out wire 181. The zigzag portion 185 has a plurality of portions that extend along the first direction x and a plurality of portions that extend along the second direction y. The portions extending along the first direction x and the portions extending along the second direction y are alternately arranged in the zigzag portion 185.

As a data fan-out wire 181 is located closer to an edge of the data fan-out 180, a length of the zigzag portion 185 included in the data fan-out wire 181 becomes shorter. In this case, the length of the zigzag portion 185 may include an entire length of a wire of the zigzag portion 185. In other words, the data fan-out wire 181 that is located closer to the edge of the data fan-out 180 has a smaller number of portions extending along the first direction x and portions extending along the second direction y.

A distance from the data driving integrated circuit 550 to a data line to be connected becomes longer as a distance from a center of the data fan-out 180 increases. In other words, the data fan-out wire 181 that is located at the edge of the data fan-out 180 is longer than the data fan-out wire 181 that is located at the center of the data fan-out 180. In this case, resistance of the long data fan-out wire 181 that is located at the edge is greater than that of the data fan-out wire 181 that is located at the center. Therefore, a different voltage drop of the data voltage may occur due to the resistance difference according to the length difference of the data fan-out wires 181, resulting in non-uniformity of luminance per region.

In addition, a difference in the lengths of the data fan-out wires 181 increases as the data flexible printed circuit board 500 gets closer to the display area DA, that is, as the peripheral area PA becomes narrower. Therefore, it has been difficult to maintain the luminance uniformly in the display area DA and to reduce a dead space corresponding to the peripheral area PA.

However, in the display device according to the exemplary embodiment, the zigzag portion 185 of the data fan-out wire 181 is formed to be shorter toward the edge from the center of the data fan-out 180, and thus the difference in resistance due to the lengths of the data fan-out wires 181 may be offset to realize uniform luminance in all areas of the display device.

The straight portion 186 may be located adjacent to the display area DA. The straight portion 186 linearly extends at the zigzag portion 185 to be connected to the data line 171 that is located in the display area DA of FIG. 1. Because the data fan-out wire 181 is located closer to the edge of the data fan-out 180, a length of the straight portion 186 thereof becomes shorter. The difference in wiring resistance depending on the length of the straight portion 186 may be substantially offset by the length of the zigzag portion 185 described above.

In addition, the data fan-out wire 181 that is located closer to the edge of the data fan-out 180 may have a width that is larger than that of the data fan-out wire 181 that is located closer to the center of the data fan-out 180. In other words, the zigzag portion 185 that is located at the edge thereof may have a larger width than that of the zigzag portion 185 that is located at the center thereof, and the straight portion 186 that is located at the edge thereof may have a larger width than that of the straight portion 186 that is located at the center thereof. Accordingly, it is possible to compensate for (e.g., more effectively cancel) the wiring resistance difference that depends on the length of the straight portion 186, by adjusting the length of the zigzag portion 185. Referring to FIG. 3, a width DW2 of the straight portion 186 is larger than a width DW1 of the zigzag portion 185. In this case, the width DW2 of the straight portion 186 and the width DW1 of the zigzag portion 185 may indicate a width in a direction that is perpendicular to a direction in which wires extend in a plan view.

The data fan-out wires 181 may be patterned using a photomask, and the photomask includes a blocking portion that is located in a region corresponding to a region where each of the data fan-out wires 181 is to be formed. Since the straight portions 186 in the data fan-out 180 are spaced less densely than the zigzag portions 185, the blocking portions of the photomask are spaced less tightly at the straight portions than at the zigzag portions, and transmissive portions are spaced more widely at the straight portions than at the zigzag portions. As a result, an amount of light reaching the straight portions 186 is relatively larger than that of the zigzag portions 185. Therefore, when the width DW2 of the straight portion 186 is made equal to or smaller than the width DW1 of the zigzag portion 185, a pattern of the straight portion 186 is excessively etched to generate a defect in which the straight portion 186 is disconnected.

However, in the case of the display device according to the exemplary embodiment, the width DW2 of the straight portion 186 may be formed to be larger than the width DW1 of the zigzag portion 185, thereby preventing or reducing the defect that the straight portion 186 is broken to be opened. For example, the width DW2 of the straight portion 186 may be in a range of 5 μm to 7 μm, and the width DW1 of the zigzag portion 185 may be 4 μm or more and less than 5 μm. However, the widths DW2 and DW1 of the straight portion 186 and the zigzag portion 185 are not limited thereto.

A minimum distance DD2 between the zigzag portions 185 of the two adjacent data fan-out wires 181 may be greater than a distance DD1 between portions that extend from the zigzag portion of the data fan-out wire 181 in the first direction x. Accordingly, a defect due to a short circuit between the zigzag portions 185 of the adjacent data fan-out wires 181 may be prevented or reduced.

An end of each of the straight portions 186 adjacent to the display area DA may be connected to an anti-static circuit. The anti-static circuit may include at least one transistor to prevent or reduce circuit damage due to instantaneous overcurrent. The anti-static circuit may be connected to the data line 171 of the display area DA of FIG. 1.

Figure 4:
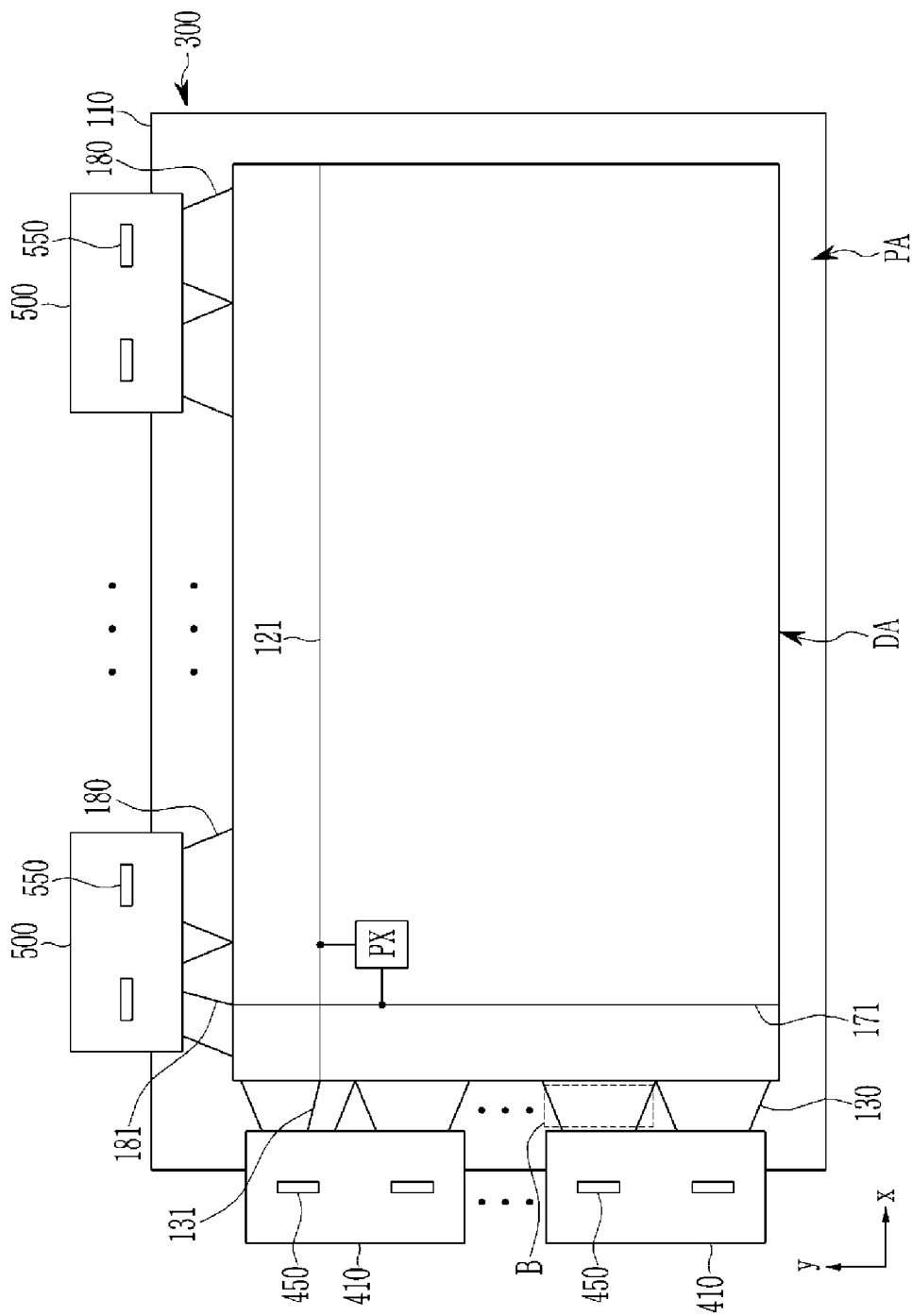
FIG. 4 illustrates a block diagram of a display device according to some example embodiments.

FIG. 4 illustrates a block diagram of a display device according to an exemplary embodiment. The display device according to the exemplary embodiment includes a display panel 300, a data flexible printed circuit board 500, and a gate flexible printed circuit board 410. Unlike the display device of FIG. 1, referring to FIG. 4, the gate driver is not directly formed on the display panel 300, and a gate driver IC 450, which is a chip type, is mounted on the gate flexible printed circuit board 410 and is connected with the display panel 300. Hereinafter, a detailed description of contents overlapping with those of FIG. 1 may be omitted.

The display panel 300 includes a display area DA for displaying an image and a peripheral area PA as a remaining area. A plurality of gate lines 121, a plurality of data lines 171, and a plurality of pixels PX connected to the gate lines 121 and the data lines 171 are located in the display area DA.

The gate lines 121 may transfer a gate signal, may extend substantially in a first direction x, and may be approximately parallel to each other.

The data lines 171 may transfer a data voltage corresponding to an image signal, may extend in a second direction y that crosses (e.g., across) the first direction x, and the data lines 171 may be substantially parallel to each other.

The peripheral area PA may be located around (e.g., to partially surround or surround) the display area DA, or may be located at an edge of the display panel 300.

The peripheral area PA may include a data fan-out 180 connected to a data line that is located in the display area DA. The data fan-out 180 includes a plurality of data fan-out wires 181. The data fan-out wires 181 are electrically connected to a data line of the display area DA in the peripheral area PA, and to a data driving integrated circuit 550 of the data flexible printed circuit board 550. The data fan-out 180 is the same as that described with reference to FIG. 1-FIG. 3.

The peripheral area PA includes a gate fan-out 130 connected to the gate line 121 that is located in the display area DA. The gate fan-out 130 includes a plurality of gate fan-out wires 131. The gate fan-out wires 131 are located in the peripheral area PA, and are located between a gate flexible printed circuit board 410 and the display area DA. A first end of each of the gate fan-out wires 131 is electrically connected to the gate line 121 of the display area DA in the peripheral area PA, and a second end of each of the gate fan-out wires 131 is connected to a gate driving integrated circuit 450 of the gate flexible printed circuit board 410 to be described later.

The gate flexible printed circuit board 410 may be bent, and one side of the gate flexible printed circuit board 410 may be connected to the gate fan-out wires 131 of the display panel 300 in the peripheral area PA of the display panel 300. The gate flexible printed circuit substrate 410 includes the gate driving integrated circuit 450 for generating a gate signal. Although one gate flexible printed circuit board 410 is illustrated in FIG. 4 to include two gate driving integrated circuits 450, the embodiment is not limited thereto, and one gate flexible printed circuit board 410 may include only one gate driving integrated circuit 450, or may include three or more gate driving integrated circuits 450.

Figure 5:
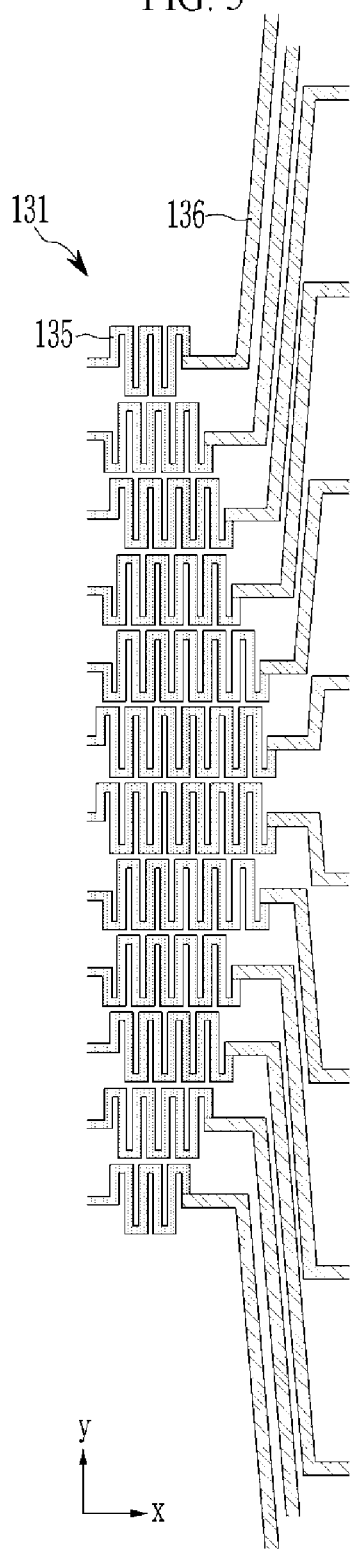
FIG. 5 illustrates an enlarged plan view of a portion B of the display device illustrated in FIG. 4.
Figure 6:
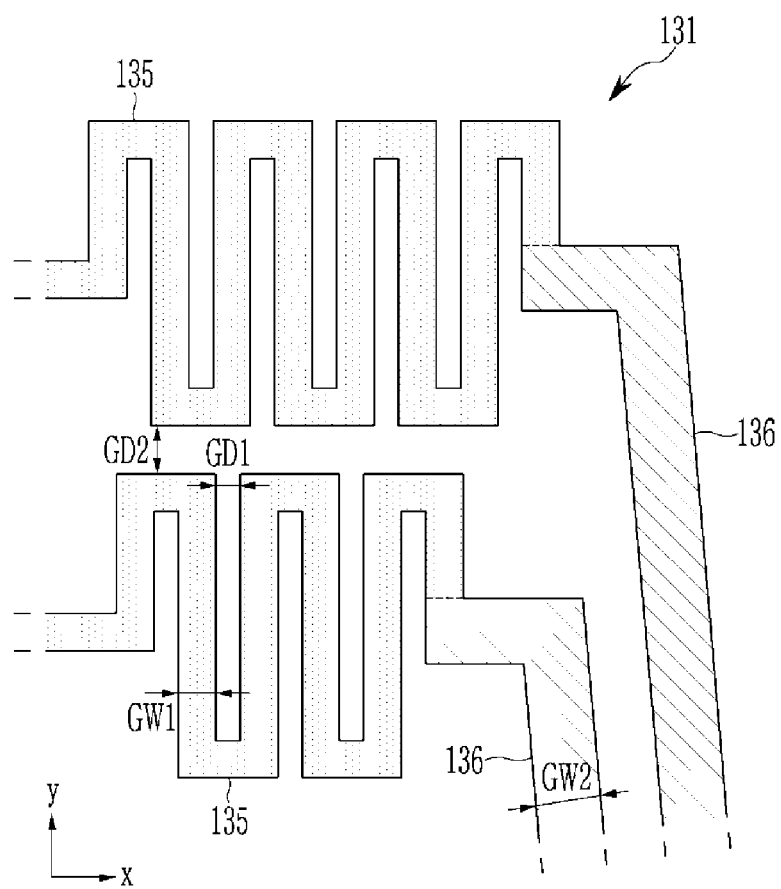
FIG. 6 illustrates a top plan view of some gate fan-out wires.

Hereinafter, the gate fan-out 130 of the display device according to some example embodiments will be described with reference to FIG. 5 and FIG. 6. FIG. 5 illustrates an enlarged plan view of a portion B of the display device illustrated in FIG. 4. FIG. 6 illustrates a top plan view of some gate fan-out wires 131. For example, FIG. 6 illustrates an enlarged top plan view of two gate fan-out wires 131 illustrated at a lower side of FIG. 5.

Referring to FIG. 5, each of the gate fan-out wires 131 includes a zigzag portion 135 and a straight portion 136. The zigzag portion 135 may be located adjacent to the gate flexible printed circuit board 410 of FIG. 4, and may extend substantially in a first direction x. One end of the zigzag portion 135 may be electrically connected to the gate flexible printed circuit board 410.

The zigzag portion 135 has a plurality of portions that extend in the first direction x and a plurality of portions that extend in the second direction y. The portions extending in the first direction x and the portions extending in the second direction y are alternately located in the zigzag portion 135.

As a gate fan-out wire 131 is located closer to an edge of the gate fan-out 130, a length of the zigzag portion 135 included in the gate fan-out wire 131 becomes shorter. In other words, the gate fan-out wire 131 that is located closer to the edge of the gate fan-out 130 has a smaller number of portions extending in the first direction x and portions extending in the second direction y.

A distance from the gate driving integrated circuit 450 to a gate line to be connected becomes longer as a distance from a center of the gate fan-out 130 increases. In other words, the gate fan-out wire 131 that is located at the edge of the gate fan-out 130 is longer than the gate fan-out wire 131 that is located at the center of the gate fan-out 130. In this case, resistance of the long gate fan-out wire 131 that is located at the edge is greater than that of the gate fan-out wire 131 that is located at the center.

Accordingly, a resistance difference occurs due to a difference between lengths of the gate fan-out wires 131. In addition, a difference in the lengths of the gate fan-out wires 131 increases as the gate flexible printed circuit board 410 gets closer to the display area DA, that is, as the peripheral area PA becomes narrower.

However, the zigzag portions 135 of the gate fan-out wires 131 may be shortened from the center of the gate fan-out 130 toward the edge thereof to offset the resistance difference due to the lengths of the gate fan-out wires 131.

The straight portion 136 linearly extends at the zigzag portion 135 to be connected to the data line that is located in the display area DA. As a gate fan-out wire 131 is positioned closer to the edge of the gate fan-out 130, a length of the straight portion 136 included in the gate fan-out wire 131 becomes longer. The difference in wiring resistance depending on the length of the straight portion 136 may be offset by the length of the zigzag portion 135 described above.

In addition, the gate fan-out wire 131 that is located closer to the edge of the gate fan-out 130 may have a width that is larger than that of the gate fan-out wire 131 that is located closer to the center of the gate fan-out 130. In other words, the zigzag portion 135 that is located at the edge thereof may have a larger width than that of the zigzag portion 185 that is located at the center thereof, and the straight portion 136 that is located at the edge thereof may have a larger width than that of the straight portion 186 that is located at the center thereof. Accordingly, it is possible to more effectively offset the wiring resistance difference depending on the length of the straight portion 136, by adjusting the length of the zigzag portion 135 and the widths of the straight portions 136.

Referring to FIG. 6, the width GW2 of the straight portion 136 of the gate fan-out wire 131 is larger than the width GW1 of the zigzag portion 135 thereof. In this case, the width GW2 of the straight portion 136 and the width GW1 of the zigzag portion 135 may indicate a width in a direction that is perpendicular to a direction in which wires extend in a plan view.

In the gate fan-out 130, the straight portions 136 are positioned less tightly than the zigzag portions 135. Therefore, when the width GW2 of the straight portion 136 is set to be equal to or smaller than the width GW1 of the zigzag portion 135, an amount of light reaching the straight portion 136 is relatively larger than that of the zigzag portion 135, and a pattern is excessively etched to cause the wires of the straight portion 136 to be opened in the etching process using a photomask.

In the case of the display device according to some example embodiments, the width GW2 of the straight portion 136 may be formed to be larger than the width GW1 of the zigzag portion 135, thereby preventing or reducing the defect that the straight portion 136 is broken to be opened.

A minimum distance GD2 between the zigzag portions 135 of the two adjacent gate fan-out wires 131 may be greater than a distance GD1 between portions that extend from the zigzag portion of the gate fan-out wire in the second direction y. Accordingly, a defect due to short-circuit between the zigzag portions 135 of the adjacent gate fan-out wires 131 may be prevented or reduced.

Figure 7:
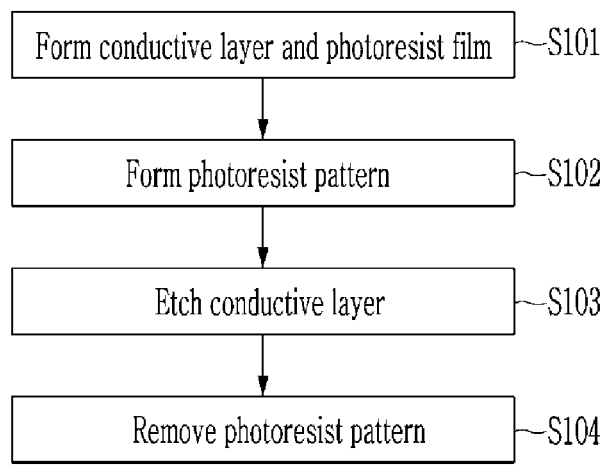
FIG. 7 is a flowchart illustrating a manufacturing method of a display device according to some example embodiments.

A manufacturing method of a display device according to some example embodiments will now be described with reference to FIG. 7-FIG. 12. FIG. 7 is a flowchart illustrating a manufacturing method of a display device according to some example embodiments.

Referring to FIG. 7, a manufacturing method of a display device according to some example embodiments includes forming a conductive layer and a photoresist film on a substrate (S101).

Next, the photoresist film is exposed and developed by using a photomask to form a photoresist pattern (S102). The photoresist film may be made of a positive type of resist.

Next, the conductive layer is etched (S103) using the photoresist pattern as the photomask to form a pattern of a zigzag portion and a straight portion of a fan-out wire, and the photoresist pattern is removed (S104). Herein, the conductive layer may be dry-etched or wet-etched.

Figure 8:
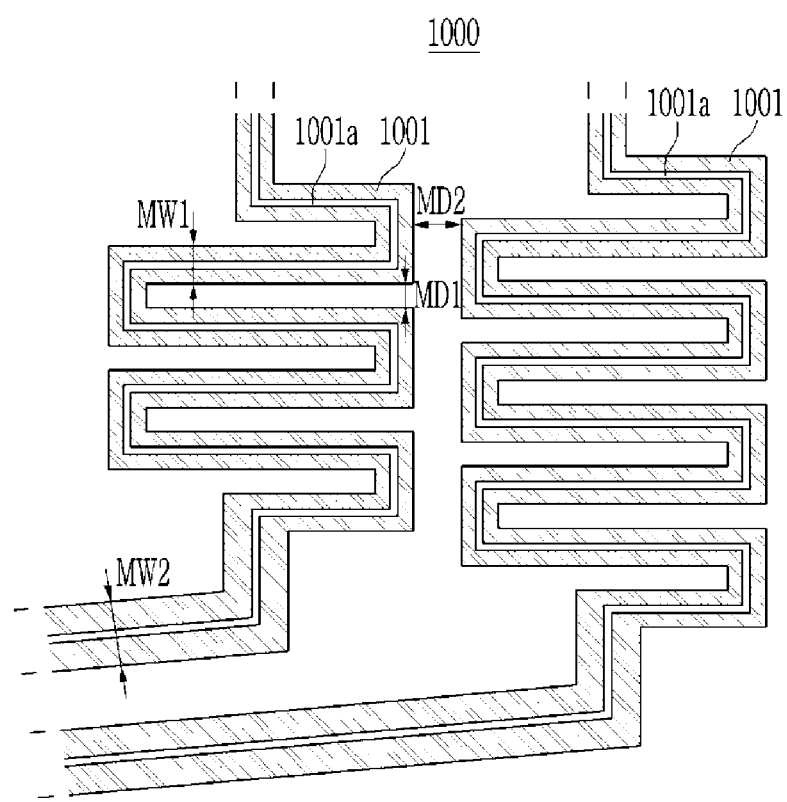
FIG. 8 illustrates a top plan view of a photomask used in a manufacturing method of a display device according to some example embodiments.

FIG. 8 illustrates a top plan view of a photomask 1000 used in a manufacturing method of a display device according to some example embodiments. For example, FIG. 8 illustrates a portion of the photomask 1000 used to form the data fan-out wires 181 illustrated in FIG. 3.

The photomask 1000 has blocking portions 1001 each of which has a shape corresponding to a pattern of each of the data fan-out wires 181. Accordingly, a width MW2 of a straight portion of the blocking portion 1001 is larger than a width MW1 of a zigzag portion of the blocking portion 1001. In addition, a minimum distance MD2 between the zigzag portions 185 of the two adjacent blocking portion 1001 may be greater than a distance MD1 between portions that extend from the zigzag portions of the blocking portions 1001 in the first direction x.

Each of the blocking portions 1001 of the photomask 1000 includes a slit 1001a that is located in the blocking portion 1001 along a direction in which the blocking portion 1001 extends. The slit 1001a may be located along a center with respect to a width direction of the blocking portion 1001. In addition, the slit 1001a may extend from the zigzag portion of the blocking portion 1001 to the straight portion of the blocking portion 1001. Although the photomask 1000 has been described in FIG. 8 to be used for forming the data fan-out wires 181 illustrated in FIG. 3, the photomask 1000 may be used to form the gate fan-out wires 131 of FIG. 6.

FIG. 9-FIG. 12 illustrate cross-sectional views showing each process step of a manufacturing method of a display device according to some example embodiments. FIG. 9-FIG. 12 illustrate a cross-section of the display device taken along a line IX-IX thereof.

Figure 9:
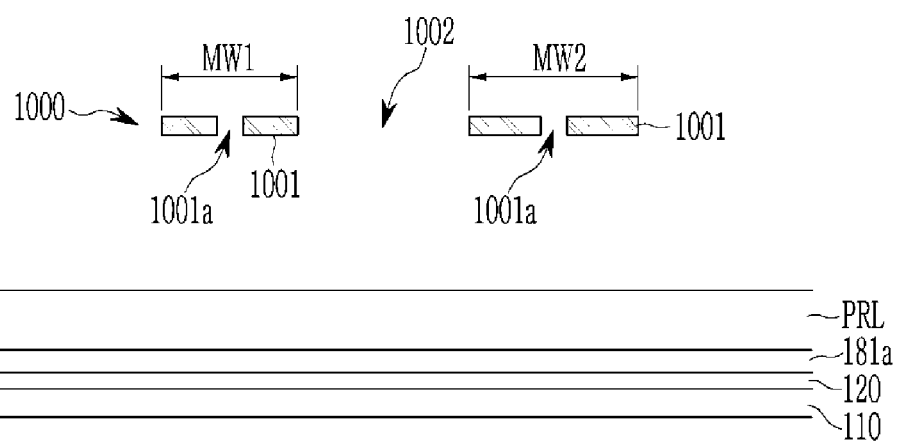
FIG. 9-FIG. 12 illustrate cross-sectional views showing each process step of a manufacturing method of a display device according to some example embodiments.

Referring to FIG. 9, an insulating layer 120, a conductive layer 181a, and a photoresist film PRL are formed (e.g., sequentially formed) on a substrate 110.

A photomask 1000 is exposed on the photoresist film PRL to expose a portion of the photoresist film PRL. The photomask 1000 includes transmission portions 1002 through which light is transmitted and blocking portions 1001 through which light is not transmitted. A width MW2 of a straight portion of the blocking portion 1001 is larger than a width MW1 of a zigzag portion of the blocking portion 1001. Each of the blocking portions 1001 of the photomask 1000 includes a slit 1001a. The blocking portions 1001 may include an opaque material. For example, the blocking portions 1001 may include chromium and the like.

When the photoresist film PRL is made of a positive type of resist, an exposed portion of the photoresist film PRL is removed. In this case, the photomask 1000 has the blocking portions 1001 in regions corresponding to regions where the data fan-out wires 181 are to be formed. On the other hand, when the photoresist film PRL is made of a negative type of resist, an exposed portion of the photoresist film PRL remains. In this case, the photomask 1000 has the transmission portions 1002 in regions corresponding to regions where the data fan-out wires 181 are to be formed. Hereinafter, a case where the photoresist film PRL is made of the positive type of resist will be described as an example.

Figure 10:
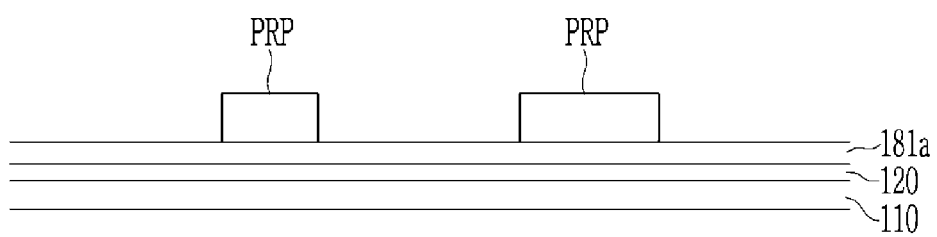

Referring to FIG. 10, the photoresist film PRL is exposed and developed by supplying light to the photomask 100 to form a photoresist pattern PRP. An exposed portion of the photoresist film PRL is removed so that the photoresist pattern PRP has a same pattern as the blocking portion 1001 of the photomask 1000. A region where the photoresist pattern PRP is formed corresponds to a region where the data fan-out wire 181 is to be formed.

When the photomask 1000 including the slit 1001a is used, a small amount of light also reaches the region on the photoresist film PRL corresponding to the blocking portion 1001. Accordingly, a width or height of the photoresist pattern PRP is formed to be smaller than that in the case of using the photomask 1000 not including the slit 1001a. That is, it is possible to pattern the conductive layer 181a with a thinner line width by using the photomask 1000 including the blocking portion 1001 of the same width.

Figure 11:
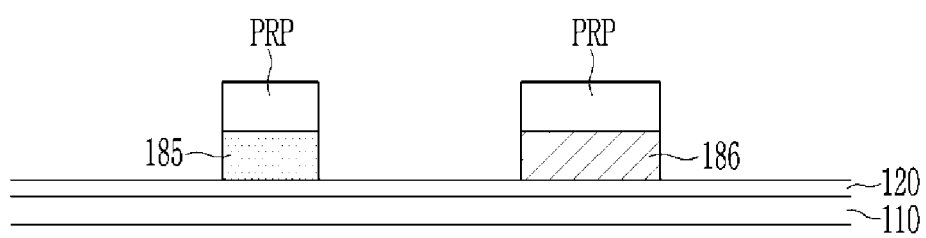

Referring to FIG. 11, the zigzag portion 185 and the straight portion 186 of the data fan-out wire 181 are formed. The zigzag portion 185 and the straight portion 186 of the data fan-out wire 181 are formed by etching the conductive layer 181a using the photoresist pattern PRP as an etching photomask. The conductive layer 181a may be etched using wet-etching. However, the embodiment is not limited thereto, and it may be etched by dry-etching.

The data fan-out wires 181 may be located in a gate layer, and may be electrically connected to the data lines 171 that are located in a data layer of the display area DA through an opening (not illustrated). However, the embodiment is not limited thereto, and the data fan-out wires 181 may be located in the data layer, or in a layer that is different from the gate layer and the data layer.

Figure 12:
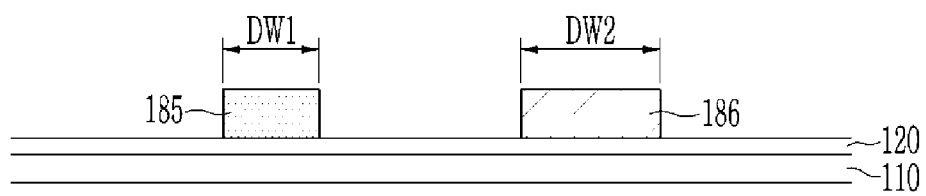

Referring to FIG. 12, the photoresist pattern PRP is removed.

The width DW2 of the straight portion 186 of the finally formed data fan-out wires 181 is larger than the width DW1 of the zigzag portion 185 thereof.

The width DW2 of the straight portion 186 of the data fan-out wire 181 may be smaller than the width MW2 of the straight portion of the blocking portion 1001 of the photomask 1000. The width DW1 of the zigzag portion 185 of the data fan-out wire 181 may be smaller than the width MW1 of the zigzag portion of the blocking portion 1001 of the photomask 1000. As described above, when the blocking portion 1001 of the photomask 1000 includes the slit 1001a, a pattern of the conductive layer 181a having a smaller width than the width of the blocking portion 1001 may be formed. Accordingly, even when the blocking portion 1001 is not densely formed, a resolution of the photomask 1000 including the slit 1001a may be increased, and thus it is easy to form a finer pattern.

Although the method of forming the data fan-out wires 181 has been described with reference to FIG. 7-FIG. 12, the same may be applied to forming the gate fan-out wires 131 of FIG. 4.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate comprising a display area and a peripheral area;
a first wiring layer substantially extending in a first direction in the display area;
a second wiring layer substantially extending in a second direction perpendicular to the first direction in the display area;
a data fan-out comprising a first data fan-out wire connected to the second wiring layer; and
a data flexible printed circuit board electrically connected to the first data fan-out wire in the peripheral area,
wherein the first data fan-out wire comprises a first zigzag portion and a first portion that extends from an end of the first zigzag portion to the display area to be connected to an end of the second wiring layer,
wherein the first portion comprises two first vertical portions and a first oblique portion between the two first vertical portions,
wherein the first oblique portion is slanted with respect to the first direction and the second direction,
wherein the entirety of the first portion including the two first vertical portions and the first oblique portion has the same constant width,
wherein the constant width of the entirety of the first portion includes the widths that are perpendicular to extending directions of the two first vertical portions and the first oblique portion, and
wherein the constant width of the first portion is larger than a width of the first zigzag portion.

2. The display device of claim 1, wherein the data fan-out further comprises a second data fan-out wire adjacent to the first data fan-out wire, the second data fan-out wire comprising:
a second zigzag portion having a second zigzag shape; and
a second portion that extends from an end of the second zigzag portion to the display area to be connected to another end of the second wiring layer,
wherein the second portion comprises two second vertical portions and a second oblique portion between the two second vertical portions,
wherein the second oblique portion is slanted with respect to the first direction and the second direction, and
wherein an entirety of the second portion has a constant width that is different from the constant width of the first portion.

3. The display device of claim 2, wherein
the second data fan-out wire is closer to a center of the data fan-out than the first data fan-out wire, and
a length of the second zigzag portion is longer than a length of the first zigzag portion.

4. The display device of claim 3, wherein
a length of the first portion is longer than a length of the second portion.

5. The display device of claim 3, wherein
a width of the first portion of the first data fan-out wire is larger than a width of the second portion of the second data fan-out wire.

6. The display device of claim 5, wherein
the data flexible printed circuit board comprises a data driving integrated circuit.

7. The display device of claim 6, further comprising a gate driver in the peripheral area.

8. The display device of claim 2, further comprising:
a gate fan-out comprising a first gate fan-out wire connected to the first wiring layer,
wherein the first gate fan-out wire comprises a third zigzag portion having a third zigzag shape and a third portion that extends from an end of the third zigzag portion, and
a width of the third portion is larger than a width of the third zigzag portion.

9. The display device of claim 8, wherein
the gate fan-out further comprises a second gate fan-out wire adjacent to the first gate fan-out wire, the second gate fan-out wire comprises a fourth zigzag portion having a fourth zigzag shape and a fourth portion that extends from an end of the fourth zigzag portion, each of the third zigzag portion and the fourth zigzag portion comprises portions that extend in the first direction and portions that extend in the second direction, and a minimum distance between the third zigzag portion and the fourth zigzag portion is larger than a distance between the portions that extend in the second direction in the second zigzag portion.

10. The display device of claim 9, wherein
the second gate fan-out wire is closer to a center of the gate fan-out than the first gate fan-out wire, and
a length of the fourth zigzag portion is longer than a length of the third zigzag portion.

11. The display device of claim 10, wherein
a length of the third portion is longer than a length of the fourth portion.

12. The display device of claim 11, wherein
a width of the third portion of the first gate fan-out wire is larger than a width of the fourth portion of the second gate fan-out wire.

13. The display device of claim 1, wherein
the data fan-out further comprises a second data fan-out wire adjacent to the first data fan-out wire,
the second data fan-out wire comprising a second zigzag portion having a zigzag shape and a second portion that extends from an end of the second zigzag portion,
each of the first zigzag portion and the second zigzag portion comprises portions that extend in the first direction and portions that extend in the second direction, and
a minimum distance between the first zigzag portion and the second zigzag portion is larger than a distance between the portions that extend in the first direction of the first zigzag portion.

\* \* \* \* \*